(12) United States Patent
Pricone

(10) Patent No.: US 8,236,407 B2
(45) Date of Patent: Aug. 7, 2012

(54) PROCESS AND APPARATUS FOR FABRICATING PRECISE MICROSTRUCTURES AND POLYMERIC MOLDS FOR MAKING SAME

(75) Inventor: Robert M. Pricone, Libertyville, IL (US)

(73) Assignee: 10x Technology LLC, Libertyville, IL (US)

( * ) Notice: Subject to any disclaimer, the term of this patent is extended or adjusted under 35 U.S.C. 154(b) by 1443 days.

(21) Appl. No.: 11/786,529

(22) Filed: Apr. 12, 2007

(65) Prior Publication Data
US 2008/0176034 A1 Jul. 24, 2008

Related U.S. Application Data

(62) Division of application No. 10/883,869, filed on Jul. 2, 2004, now abandoned.

(60) Provisional application No. 60/485,268, filed on Jul. 7, 2003.

(51) Int. Cl.
*B32B 3/26* (2006.01)
*G02B 5/122* (2006.01)

(52) U.S. Cl. ........ 428/156; 428/131; 359/529; 359/530; 359/532

(58) Field of Classification Search ............... 428/131, 428/156; 359/529, 530, 532
See application file for complete search history.

(56) References Cited

U.S. PATENT DOCUMENTS

| | | | |
|---|---|---|---|
| 3,359,671 A * | 12/1967 | Nier et al. ............ | 40/615 |
| 3,689,346 A | 9/1972 | Rowland | |
| RE28,068 E | 7/1974 | Lemelson | |
| 3,935,359 A | 1/1976 | Rowland | |
| 4,104,416 A | 8/1978 | Parthassarathy et al. | |
| 4,205,028 A | 5/1980 | Brueggemann et al. | |
| 4,349,601 A | 9/1982 | Brueggemann et al. | |
| 4,472,451 A | 9/1984 | Mulder | |
| 4,478,769 A | 10/1984 | Pricone et al. | |
| 4,486,363 A | 12/1984 | Pricone et al. | |
| 4,519,884 A | 5/1985 | Ritchie | |
| 4,601,861 A | 7/1986 | Pricone et al. | |
| 4,711,833 A | 12/1987 | McAneney et al. | |
| 5,304,332 A | 4/1994 | Richart | |
| 5,468,542 A | 11/1995 | Crouch | |
| 5,512,219 A | 4/1996 | Rowland et al. | |
| 5,565,151 A | 10/1996 | Nilsen | |
| 5,614,286 A | 3/1997 | Bacon, Jr. et al. | |

(Continued)

FOREIGN PATENT DOCUMENTS

DE  2 140 299  8/1973

(Continued)

OTHER PUBLICATIONS

Charles A. Harper, Modern Plastics Handbook, 2000, McGraw-Hill/McGraw-Hill Companies, Inc., pp. C.28, C.29, C.44 and C.45.

*Primary Examiner* — William P Watkins, III
(74) *Attorney, Agent, or Firm* — McDonnell Boehnen Hulbert & Berghoff LLP

(57) ABSTRACT

There is disclosed a method and apparatus for producing a polymeric film that accurately replicates a complex mold surface at least a portion of which surface has microstructured or nano-structured dimensions. A polymeric powder is electrodeposited on an underlying mold surface. Then the powder is cured to create a polymeric film. Finally the film is removed from the mold surface.

11 Claims, 8 Drawing Sheets

U.S. PATENT DOCUMENTS

| | | |
|---|---|---|
| 5,657,162 A | 8/1997 | Nilsen et al. |
| 5,706,132 A | 1/1998 | Nestegard et al. |
| 5,763,049 A | 6/1998 | Frey et al. |
| 5,885,490 A | 3/1999 | Kawaguchi et al. |
| 5,971,732 A | 10/1999 | Grisch et al. |
| 6,004,422 A * | 12/1999 | Janovec et al. ............... 156/276 |
| 6,010,609 A | 1/2000 | Mimura et al. |
| 6,086,813 A | 7/2000 | Gruenwald |
| 6,120,280 A | 9/2000 | Mimura et al. |
| 6,235,228 B1 | 5/2001 | Nicholl et al. |
| 6,486,226 B2 | 11/2002 | Al-Akhdar et al. |
| 6,524,517 B1 | 2/2003 | John et al. |
| 6,537,671 B2 | 3/2003 | Muthiah |
| 6,592,967 B2 | 7/2003 | Kaufman |
| 6,899,838 B2 | 5/2005 | Lastovich |
| 2001/0040097 A1 | 11/2001 | Arao et al. |
| 2003/0102591 A1 | 6/2003 | Thielman et al. |
| 2003/0232174 A1 | 12/2003 | Chang et al. |
| 2004/0069637 A1 | 4/2004 | Eswarakrishnan et al. |

FOREIGN PATENT DOCUMENTS

| | | |
|---|---|---|
| DE | 100 45 955 | 4/2002 |
| GB | 1 327 586 | 8/1973 |

* cited by examiner

PROCESS AND APPARATUS FOR FABRICATING PRECISE MICROSTRUCTURES AND POLYMERIC MOLDS FOR MAKING SAME

REFERENCE TO RELATED APPLICATIONS

This application is a division of U.S. application Ser. No. 10/883,869, filed Jul. 2, 2004, now abandoned.

This application claims the benefit of U.S. provisional patent application Ser. No. 60/485,268, filed Jul. 7, 2003 entitled "A Process And Apparatus for Fabricating Precise Microstructures And Polymeric Molds for Making Same."

BACKGROUND OF THE INVENTION

Fabrication of microstructured and nano-structured products known to be of interest in various industries include arrays of structured elements having optical applications, such as lenticular lenses, Fresnel lenses, light guides, diffusers, retro-reflective films, micro-lens arrays, brightness enhancement film (BEF) and LED arrays. Other applications include, biomedical components, micro-fluidic products, tissue culture media, micro-electrical-mechanical (MEMS), micro-acoustical, Chemical Mechanical Planerization (CMP), fuel cells, and other geometries that benefit from high speed, precision, microfabrication technology that provides high volume commercialization at economical cost.

The present invention has novel advantages because mold cost and fabrication time is reduced, which translates to faster scale-up and commercialization but also benefits from higher manufacturing speed than the prior art. The invention also allows the use of a wider range of materials than the prior art, including both thermoplastic, and thermoset polymers, either potentially loaded with other second phase or filler materials such as, for example, ceramic, glass or metal powders. Such latitude in prior art processing does not exist or creates significant tool wear. The present invention provides the ability to microform materials withstanding higher use temperatures or that become polymer composites, having improved mechanical, electrical or optical properties which are of significant benefit for some end use applications, beyond the narrow range of typically used polymers.

The present invention adapts several commercially known techniques to achieve novel results.

In accordance with the present invention, polymeric products can be made by electrodepositing powdered polymer by means of a variation of the process generally known as powder coating. This process, sometimes referred to as solventless or dry painting, does not require the use of any liquids and therefore eliminates the problems associated with air entrapment. Powder is applied to the mold from the bottom up eliminating the possibility of air being trapped and speed is only limited by the melt time and cure rate of the polymer.

The powder coating industry is well known for coating metal substrates but has more recently made significant innovations to reduce both the cure temperature and cure time thereby allowing temperature-sensitive substrates such as wood and PVC to be coated. Two of the major industry innovators are Rohm and Haas Morton Powder Coatings (MPC) and Dupont Powder Coatings. Some of the typical polymers used for the powder coating process are acrylics, generally recommended for extreme weather-resistance, epoxy resins for pipe and office furniture, epoxy-polyesters for light fixtures and shelving, polyesters for paneling, automotive components & garden furniture and silicones for high-temperature applications such as barbecue grills.

Application equipment to dispense the powder is quite sophisticated and complete systems from companies such as ITW-Gema, and Wagner provide complete automated systems that apply powder electrostaticly to parts on a conveyer-line and are then cured. Of specific interest is equipment which has been designed for continuous webs such as coil coating. Powder is applied to moving steel coils at relatively high speed (20-30 ft min.) and thickness of 50-200 microns (0.002"-0.008") then cured and wound up into rolls. This equipment is substantially similar to what would be required to make continuous rolls of microstructured film as described in this application.

Conventional powder coatings are heat cured at temperatures that range from 300° F. and higher. These are useful for fabrication processes that use metal molds or high melt temperature polymeric molds, but in some cases there are advantages to using polymeric molds that have lower temperature stability. For fabrication processes that use low temperature polymeric molds, low temperature powder coatings are of value. Of particular interest are some of the recently developed. UV powder coatings, which can cure in 1-5 seconds at temperatures as low as 125-175° F. Low temperature curing powder coatings are also of value when combining different layers of polymers to achieve products that have specific physical, chemical or optical properties.

Powder particle sizes range from 5-20 microns in diameter but it is possible to achieve even smaller sizes. The ability to achieve small particle sizes is important to some aspects of this invention because in some applications, there is a need to replicate microstructures with high aspect-ratios or with very small functional features. In the case of a high-aspect ratio feature, a mold with a recessed microstructure only 10 microns wide and 50 microns deep (5:1 aspect ratio) the associated powder would have to be small enough to fill the recessed opening of the mold.

SUMMARY OF THE INVENTION

The present invention relates to a process and apparatus used to microfabricate precision microstructures, nano-structures and the methods of making polymer molds. Typically microstructures are considered to be in the range of 0.010 inches (250 microns) to 0.000393 inches (1 micron) and nano-structures to be below 0.00000393 inches (0.001 microns). For purposes of convenience only, the phrase microstructure as used herein shall be deemed to include those small macrostructures requiring precision optical configurations that require precise dimensions, angles and surfaces, such as cube-corner reflection; parabolic surfaces for LED's; dihedrals for light guides and others known to those skilled in the optics art. In some instances, the present invention also has great utility in forming complex patterns of precise optical configurations in relatively small macrostructures, in the range of 1 mm to 10 mm.

A primary object of the invention is to provide a method and apparatus for creating a polymeric film that accurately replicates a complex mold surface at least a portion of which surface has microstructured or nano-structured dimensions.

Another object of the invention is to provide an article comprised of a layer of polymeric material at least a portion of which contains a surface area of a complex array of microstructure of optically precise dimensions.

Another object of the invention is to provide a process for forming molds that contain microstructured and nano-structured patterns by electrodeposition of layers of thermoplastic or thermoset polymers (with and without incorporation of second phase materials).

Another object of the invention is to provide apparatus for continuously forming thermoplastic or thermoset precision microstructured products using either polymeric or metal molds.

Another object of the invention is to continuously form polymeric products having precision microstructures and nano structures.

Another object of the invention is to provide apparatus and a process to form precision microstructures in polymers with multiple hard or soft layers.

Another object of the invention is to provide polymeric molds and microstructured products from commercially available polymer layers rather than custom formulating polymers.

Another object of the invention is to form polymeric precision microstructures with through holes or vias.

In summary, there is provided a method of producing a polymeric film that accurately replicates a complex mold surface at least a portion of which surface has microstructured or nano-structured dimensions, comprising the steps of:

(a) electrodepositing a polymeric powder on an underlying mold surface;
(b) curing the powder to create a polymeric film; and
(c) removing the polymer film In further summary, there is provided an apparatus for continuously producing a web of polymeric film that accurately replicates a complex mold surface at least a portion of which surface has microstructured or nano-structured dimensions, comprising:

(a) means for electrodepositing a layer of polymeric powder onto an underlying mold surface;
(b) means for effecting a cure of said powder to create a polymeric film; and
(c) means for facilitating removal of the film from the mold.

In further summary, there is provided an article comprising a polymeric film having a portion which is a surface area of a complex array of microstructure of optically precise dimensions and wherein said article is formed by curing a powder which has been electrodeposited against a mold surface defining the shape of at least a portion of the article.

An important advantage of the invention is the ability to make polymeric molds as part of the apparatus to form precision microstructures. Since many of these powdered polymers and particularly the UV cure version can be deposited and polymerized into a mold at low cure temperatures, a polymeric mold becomes a faster and less expensive alternative to metal molds described in prior art.

Such a polymer mold has multiple cost and process advantages. By fabricating a polymeric mold consisting of high glass transition polymer or thermosetting polymer, it is possible to replicate lower glass transition polymers using the process described in U.S. Pat. No. 4,486,363 or any improved versions of hot polymer embossing without the cost or time required to build large cylindrical metal molds.

Apparatus and methods are disclosed for fabricating a polymeric mold by electrostatically applying a powdered polymer layer on to a master microstructured pattern. Master patterns can be made by a number of recognized methods such as diamond turning, ruling, deep reactive ion etching (DRIE) or other techniques that provide such patterns. The master pattern or an electroformed copy of the master pattern can be used to make polymeric copies quickly and inexpensively that can be assembled by tiling methods known in various industries. This assembly of parts into a larger mold can be used in conjunction with further disclosed assembly apparatus such as die cutting and precision positioning equipment to provide larger molds for use in fabricating microstructured products.

It has also been demonstrated that pieces of a polymer film mold can be adhered to a stronger backing such as stainless steel or other suitable substrates that would give the composite additional strength and durability as well as electrostatic conductivity.

Another method to make a polymeric mold would be to provide a small and inexpensive electroformed mandrel to fabricate a polymer mold of any length or even continuous rolls of such molds by the use of a scaled down version of the apparatus described in U.S. Pat. No. 4,486,363 or 4,601,861.

Yet another method to make a polymeric mold would be to first fashion a small mold as a small continuous belt, then apply a polymer layer continuously that will provide replication of the small mold to provide a mold of any required length.

One of the primary advantages of this technique is that the master pattern or mold fills from the bottom up as the powder is deposited. Making polymeric molds by embossing as defined in U.S. Pat. Nos. 4,486,363 and 4,601,861 requires the viscous polymer to be pushed down from the top, trapping air during the process and is limited to thermoplastic polymers. In accordance with the present invention, small particle size and, in particular, sub-micron and nano-scale particles have advantages in filling sub-micron and nano-scale complex features as compared to the viscosity and surface tension limitations of hot-polymer or liquid replication found in embossing or casting techniques.

Another primary advantage is that the polymer layers can be made from thermoset or UV curable polymers which have much higher service temperature and dimensional stability.

Using any of the above methods to provide a polymeric mold, powdered polymers available from various industry sources can be used to make either individually replicated parts with microstructured patterns or continuously fabricated film wound into rolls.

The present invention is a significant enhancement of the typical formation of conventional powder coating materials, wherein thermoplastic or thermosetting polymers are ground to fine particles sizes and combined with pigments to provide color, and other additives specifically designed to ensure adhesion to a variety of different substrates. The present invention allows for the elimination of pigments and adhesion promoters thus permitting conventional powder coating apparatus to electro-deposit pure powdered polymers on to molds, where they then can be cured in place and then removed as a continuous film.

Commercially available or custom formulated powdered polymers can be selected based on the final products requirements for physical properties, chemical resistance, weatherability, service temperature, refractive index and light transmission among others.

The simplest form of this invention would be to use a powder version of the acrylic or polycarbonate polymers used in the prior art (U.S. Pat. Nos. 4,486,363 and 4,601,861), then electrostatically apply the powder into a mold, cure the layer with the replicated pattern now locked in the polymer and remove the layer form the mold. Since the need for these two polymers has been well established in the field of optical and other light management microstructures, they would be among the preferred embodiments of this invention.

In conjunction with the novel method of making a polymeric mold one of the primary advantages of this technique to fabricate microstructured products is that the mold fills from the bottom up as the powder is deposited. Prior art requires the polymer to be melted and the high viscosity liquid pushed down from the top while trapping air during the process and making it more difficult to achieve the levels of precision required in smaller micro and nano-structured precise patterns.

Another primary advantage of using a powder layer to fill the mold is that the microstructure features typically represent a minority cross-section of the entire product and can be quickly filled then laminated to a thicker backing thus eliminating the need to melt and form the entire substrate. An example of this is Brightness Enhancing Film (BEF) known in the industry to improve the brightness efficiency of notebook computer screens. This film typically is 0.006 inch (150 microns) thick with a microstructure having a cross section of typically 0.005 inch (12 microns). In accordance with the present invention, the need to melt and reform 0.006 inch (150 microns) polycarbonate is unnecessary if the features are replicated with powdered polymer, cured and then laminated to the polycarbonate backing.

Another primary advantage is the speed of application and cure speed compared to prior art. Typical industry speeds for powder coating and especially continuous powder coating such as for coil coating steel sheet can be 20-30 feet per minute (6-9 meters) at width up to 8-10 feet (2.4-3 meters).

An additional advantage is that different powder formulas can be applied in layers. If a hard outer surface of the microstructure is required the first thickness of powder could be nylon or other sufficiently hard materials, followed by as many different layers as required. During the cured phase they will all fuse together forming gradients of hardness. The fused multilayer film with the microstructured pattern now locked in is now removed from the mold. This layering technique is particularly useful for fabricating micro-needles which must be hard enough at the tip to puncture skin but resilient enough at the base not to shear-off under stress. The same can be done for other physical properties, such as modulus or resiliency, linear expansion coefficients and tailored chemical properties such as resistance to acid, caustic, moisture barrier properties or resistance to solvent-base chemicals.

Yet another advantage is a means to produce precision through-holes in polymers, or micro-vias, by partially filling a mold leaving the top of the microstructures uncovered. The use of a soft polymeric backing-film can insure removal of any powder on the tips of the mold and a planer surface on the packed powder. Once cured, the polymer can be removed leaving a precision structured through-hole or via formed by the projected microstructure in the mold. An additional advantage of this method allows the holes to be made in a variety of shapes, such as a circle, triangle, square, etc and tapered to any degree, as determined by the mold structure.

Still another advantage of this invention also allows microstructures to be formed onto ridged substrates. Once the mold is filled with the powdered polymer, it can be laminated to a ridged polymeric sheet and then cured; thereby fusing the microstructured pattern to a much thicker support member. An example of this advantage can be demonstrated by laminating and then fusing clear, polymeric micro-prisms to a thick sheet of ridged clear backing. Typical ranges for the microstructures could be 64 micron tall micro-prisms (0.0025 inch) fused to 0.375 inch ridged sheet. The resulting combination would provide a retro-reflective, micro-prismatic product ridged enough to be a ready made road sign. Normally, micro-prismatic retro-reflective sheeting as described in U.S. Pat. Nos. 4,486,363 and 4,601,861 must be manufactured with adhesive backing and then later applied to a treated aluminum panel that provides a rigid support member. The described novel approach attaches the micro-prisms directly to a polymeric support member such as polycarbonate or another clear impact resistant polymer; eliminating the adhesive and fabrication operations, significantly reducing cost and fabrication time.

Another advantage of this invention is to use polymer powder directly from the polymerizing process, bypassing the need to form pellets and extrude film. This is of particular advantage for polymers such as polycarbonate which are first generated as powder, then pellets and then extruded into film. In the case where some polymers are not normally produced as powder, it still may be an advantage to grind the polymer into powder, rather than extrude pellet into film and then try to replicate the film.

Another advantage of using powder directly from the reactor is the absence of additives that are necessary for the extrusion or injection molding process that would improve optical properties such as bulk absorbitivity and light transmission.

BRIEF DESCRIPTION OF THE DRAWINGS

While the drawings depict preferred embodiments of the present invention, they are by way of example only and it is not intended to limit the scope of the invention. It is expected that variations and further modifications as well as further applications of the principles of the invention will occur to others skilled in the art and while differing from the foregoing, remain within the spirit and scope of the invention as described.

FIG. 12 D is magnified view of an individual through hole in FIG. 12C

DETAILED DESCRIPTION

Figure 1:
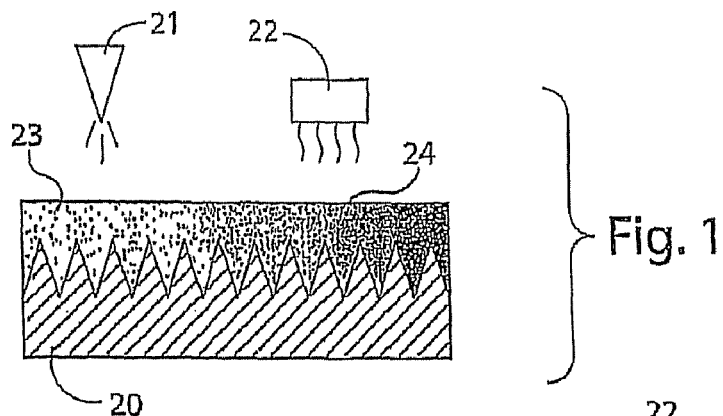
FIG. 1 is a schematic edge view of a master pattern, with a thermoplastic powdered polymer being applied and cured, providing a film having the master pattern accurately replicated on the film surface.

Referring to FIG. 1, a method to make polymeric mold sections is shown including a master pattern 20 made of electrodeposited nickel having a representative lenticular microstructure on the surface. Metal molds or tools for producing such devices are well known in the optics art.

An electrostatic gun 21 such as Wagner's Corona PEM-C3 Manual Spray Gun is used to apply a 0.004" layer of epoxy based 445-100-1 CORVEL® GREEN powder 3 from Rohm and Haas Morton Powder Coatings, with a particle size of 10 microns. A source of infra red radiation 22 such as an electric or gas IR emitter at a temperature of 350° F. (176° C.) for two minutes is used to melt and flow the powder 23 which then cures as a polymer film 24. The master pattern 20 may be metal or polymeric as long as it is dimensionally stable at the cure temperature required for the polymers being applied. One of the primary advantages of using powder to form the polymeric layer over the master pattern is that it fills the pattern from the bottom up as the powder is being deposited, eliminating air entrapment, one of the problems common to prior art embossing or casting techniques.

Normally, substrates that are powder coated are surface treated with an adhesion promoting chemical bath prior to application of the powder to assure adhesion of the powder coating. In this case however since the objective is to melt, cure and then remove the polymer as a film with the pattern replicated on the surface 24, the surface treatment of the master pattern 20 was omitted prior to application of the powder. In addition, since most powder coating products are formulated with adhesion promoting additives each product has to be tested to insure it will separate from the master pattern or mold. In some cases adhesion promoting additives may be intentionally omitted from a powder formulation if it is found to interfere with the removal process.

The epoxy based 445-100-1 CORVEL® worked well but the process is not limited to this product. Many other thermoplastics or thermoset powdered polymers 23 commercially available from suppliers such as Rohm and Haas Morton Powder Coatings or Dupont Powder Coatings are suitable for the process. The powder selection and size would be dependant on the end use of the finished product. The suitability of commercially available powder coatings for this application is based on several factors including chemical, physical and optical properties, melt point and the ability to release from the mold substrate. Among the thermoplastics are polyesters, acrylics, urethanes, Nylons, polypropylenes, polyethylenes, polyvinylchlorides and silicones. Among the thermosets are epoxies, epoxy-polyesters, and UV curable formulations.

There is a also an unexpected significant advantage in using powdered polymer produced directly from the polymerizing process and bypassing the need to extrude film for some microfabrication processes. This is of particular advantage for polymers such as polycarbonate which are normally made as a powder, which is then formed into pellets and then extruded into film before it is re-melted and pressed into molds. Additionally, other commercially available extrusion grade thermoplastic resins, not normally used for powder coating, such as polycarbonates from GE Plastics or acrylics from AtoFina can be bought in pellet form and ground into powder for electrostatic application such as described in this application.

Figure 2:
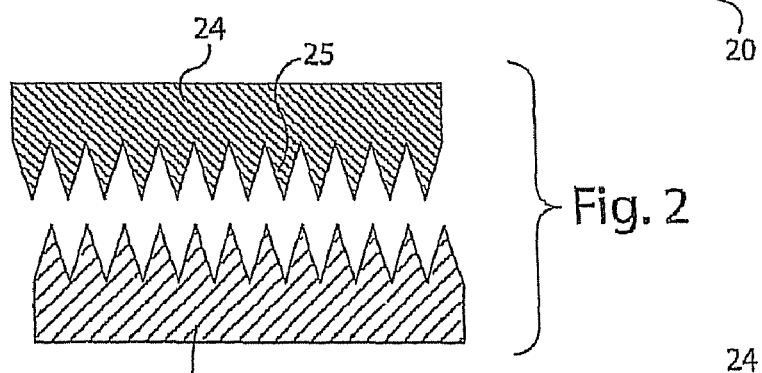
FIG. 2 is an edge view of the cured thermoplastic polymer film being removed from the master pattern with the replicated, precision microstructure on the surface.

Referring to FIG. 2, the epoxy based 445-100-1 CORVEL® cured polymeric film 24 with the lenticular precision microstructure now replicated on the surface 25 is easily removable from master pattern 20. The lenticular precision microstructured pattern 25 has been accurately formed on the surface. Moreover, the separated film itself can be used as a mold to make subsequent replications with lower melt point powders. In this case, the film 5 was 0.004 inches (100 microns) thick.

Microscopic examination of the removed polymer film 24 showed there was accurate replication of the lenticular pattern 25 in the polymer which is flexible enough to handle, bend and itself be used as a mold.

Figure 1A:
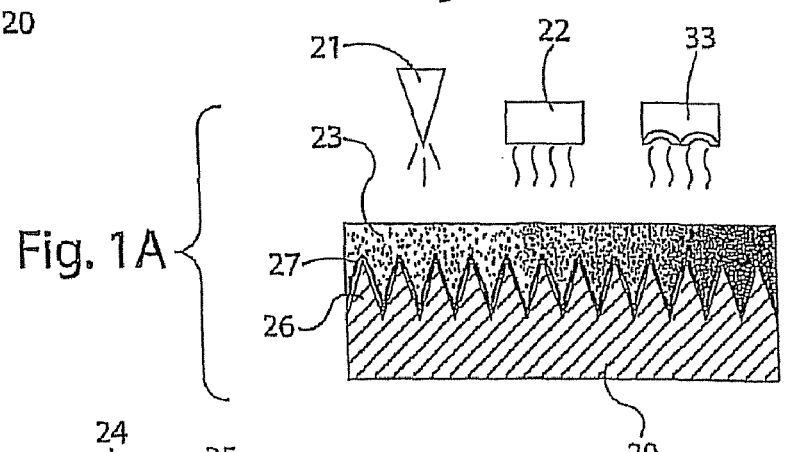
FIG. 1A is a schematic edge view of a master pattern, with a thermoset, UV curable powdered polymer being applied and cured, providing a film having the master pattern (or mold) accurately replicated on the surface.

Referring to FIG. 1A the polymeric powder 23 is a clear UV curable product designated NX3-9067 Clear, also from Rohm and Haas Morton Powder Coatings. In this case because the cure temperature of the UV curable polymer 23 is only 175 F (79° C.), a polymeric master pattern 20 was used. The polymer master pattern 20 was Auto Haas DR100, an impact modified PMMA with a precision micro-prismatic structure 26 formed on the surface. Prior to application of the powdered polymer 23, the master pattern surface 20 was vapor deposited with an aluminum layer 27 to help insure electrostatic charge through the powder coating application process. Again, for this experiment the use of pretreatments that surface etch substrates to improve adhesion of the polymer, was avoided. The powdered polymer 23 was applied in a 0.0010" (250 microns) thick layer using a Wagner Corona PEM-C3 Manual Spray gun 2A. The sample was heated with an IR emitter 6A to a temperature of 175° F. (79° C.) for two minutes to melt the polymer powder, then cured by UV radiation 8 with a 600 watt mercury lamp for two seconds.

The same conditions were also used for a metal substrate made of nickel with a lenticular microstructure on the surface, the only exceptions being that the vacuum metallized layer was not needed since the metal substrate was already conductive.

Figure 2A:
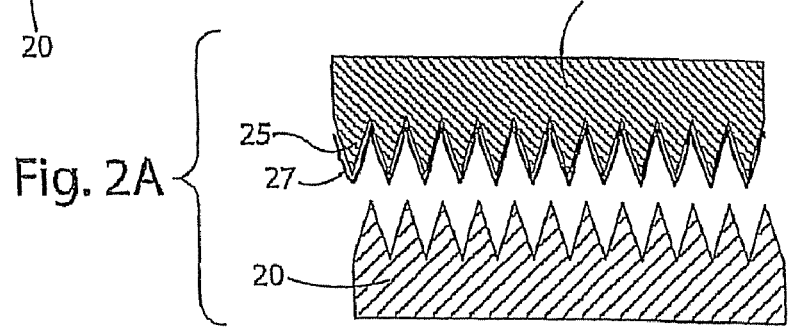
FIG. 2A is a view similar to FIG. 2 of a UV cured thermoset polymer film being removed from the master pattern with the replicated, precision microstructure on the surface.

Referring to FIG. 2A the cured polymeric film 24 with the precision microstructure now replicated on the surface 25 is easily removable from master pattern 20 along with the metallized layer 27. Of particular importance is the replicated accuracy of the UV cured polymer film removed from the micro-prismatic, polymeric master pattern. Micro-prisms function as precision retro-reflectors if formed within high dimensional tolerances. Typically, angle tolerances must be held with 2 minutes of arc or 99.9% of the required geometry, and surface flatness must be within 1000 Angstroms or 0.000003" in order to function properly. Examination of the micro-prismatic structures in the polymer film 24 removed from the master pattern demonstrated they were functional retro-reflectors and therefore dimensionally within the accuracy of these tolerances. Moreover, the separated film can be used to make subsequent replications.

Figure 3:
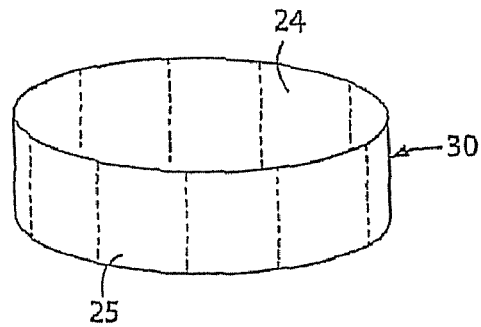
FIG. 3 is a perspective view of sections of the replicated polymer film assembled to make a thin flexible belt to be used as a continuous mold.

Referring to FIG. 3, a plurality of sections (13 in FIG. 3) of cured polymeric film 24 with the microstructured pattern 25 are cut and assembled to provide an endless, flexible belt 30 to be used as a mold.

Figure 4:
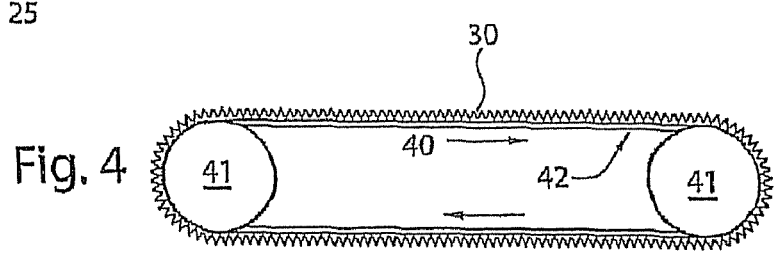
FIG. 4 is a side view of the assembled mold sections used as a flexible belt driven by rollers.

Referring to FIG. 4, the polymeric belt 30 in FIG. 3 is flexible enough to be used in the path 40 driven by two rollers 41. One preferred embodiment would have the sections adhesively bonded to a strong metallic or polymeric backing such as stainless steel or Kapton® film 42 to improve strength and durability.

The prior art or other equipment used to emboss thin film similar to the equipment herein would include film produced hereby as a mold, as disclosed in greater detail in U.S. Publication 20030232174 published Dec. 18, 2003, the subject matter of which is incorporated herein in full by reference.

Figure 5:
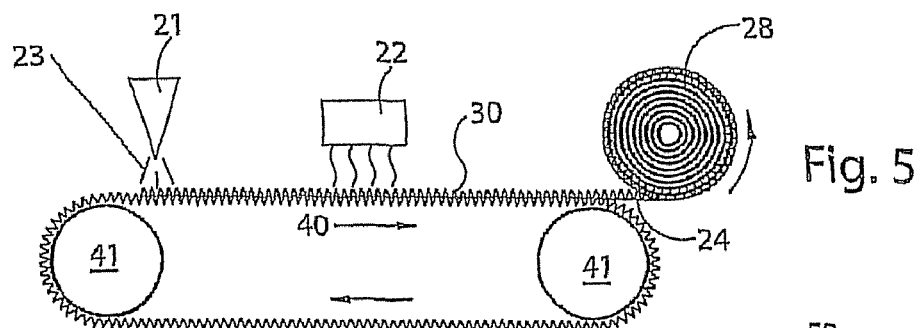
FIG. 5 is a schematic view of the apparatus to make long lengths of replicated polymeric layers to be used as a mold.

Referring to FIG. 5, another method to make a polymeric mold of much longer length for production apparatus that requires such a mold, is to first fabricate a much smaller mold, perhaps 12" (30.48 cm) in diameter or smaller, to be used as an endless belt 40, which is then replicated by having powdered polymer 21 applied, melted and cured by 22 using IR heat or UV radiation. The cured film is then removed from the mold, and wound into rolls 28.

Figure 6:
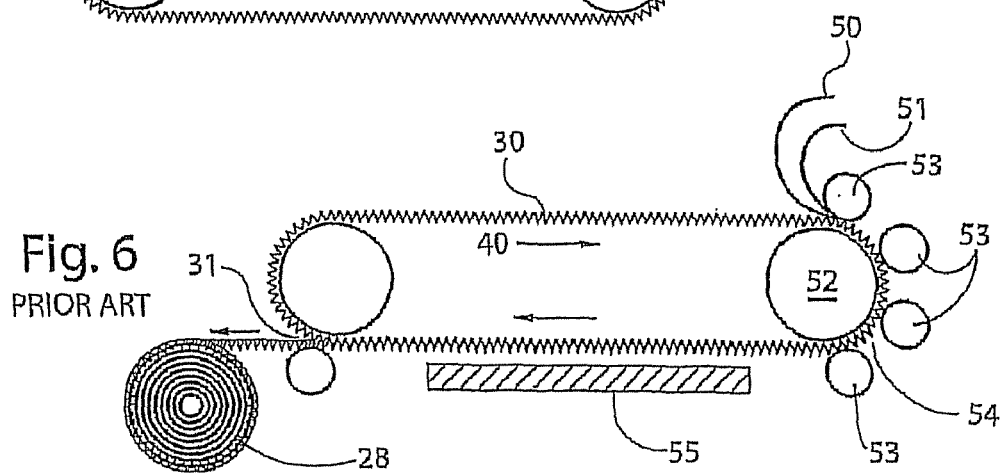
FIG. 6 is a schematic view of one form of prior art apparatus being used to make long lengths of a polymeric mold.

Referencing FIG. 6, yet another method to make a polymeric mold of long length, is by adapting a miniature version of prior art embossing apparatus such as disclosed in U.S. Pat. No. 4,486,363 or 4,601,861 which can be used to make long lengths of microstructured polymeric molds for use with the apparatus disclosed in this application. Extruded polymeric film such as GE 0.006" (150 microns) polycarbonate 50 along with a higher melt point carrier film such as 0.002" (50 micron) PENN 51 is heated by hot roll 52 to a temperature of 425° F. (137° C.). A plurality (4 in FIG. 6) of pressure rolls 53 at 150 psi (10.5 bar), flow the polymer into the Fresnel pattern on the metal mold 30 in the path 40. The hot film 54 now with the mold pattern transferred to the surface is solidified by cooling station 55, removed from the mold 31, then wound into rolls 28. In this case the embossed film can be used as the underlying mold surface in the powder technique of the present invention.

Figure 7:
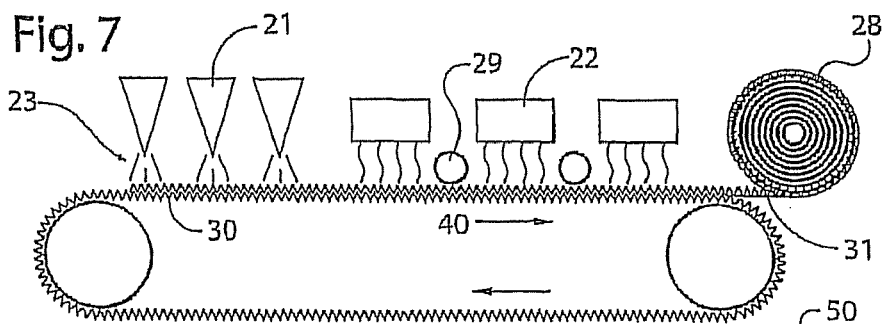
FIG. 7 is a schematic view of the apparatus to make a multi-layered continuous microstructured product.
Figure 7A:
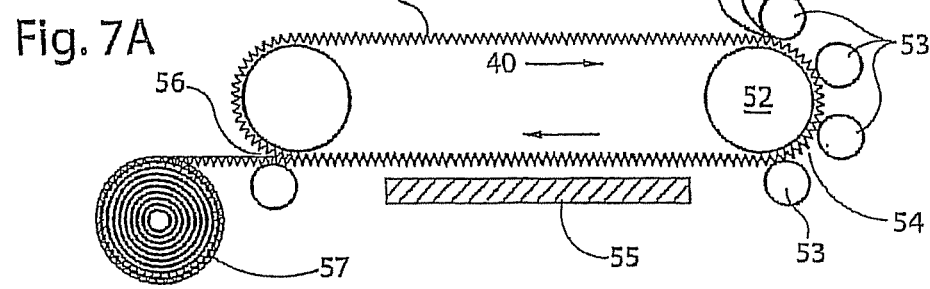
FIG. 7B is a schematic view of an alternative apparatus to make the continuous microstructured product.

Referencing FIG. 7, one method to fabricate microstructured products at higher speeds than heretofore available involves use of a polymeric mold 30 as illustrated in FIG. 5 or FIG. 6, of considerable length, used in path 40 of perhaps 100 feet or more. A mold of this size would allow the use of multiple powder application stations 21 (3 in FIG. 7), to apply a layer of powdered polymer 23, and a plurality (3 in FIG. 7) of cure stations 22 to achieve speeds of 50 or 100 ft/min (16 to 33 meters min). A plurality of smoothing rolls 23 (2 in FIG. 7) will speed the flow of molten polymer during the melt stage and prior to final cure. Finished product is then removed as a separate and flexible film 31, and then wound into rolls 28. Speed of the apparatus is limited only by the rate of powder application and length of the IR emitters to melt and cure the polymer. UV curable polymer would further increase the cure speed and produce more product per hour with a similar length mold.

FIG. 7B depicts an alternative method of fabricating precision microstructured products using polymeric molds as opposed to metal molds with prior art apparatus. The machine used was substantially similar to that described in U.S. Pat. Nos. 4,486,363 and 4,601,861 operating at a temperature of 300° F. (149° C.), a pressure of 150 psi (10.4 bar) and a speed of 2 feet (61 cm) min. A flexible polymeric film 30 was used in an elliptical path as a mold in the prior art apparatus, in place of the metal mold originally taught. A Fresnel pattern on the surface of 0.0060 inch (150 micron) GE polycarbonate was used as the elliptical mold 40 to replicate the pattern on to 0.005 inch (125 micron) PVC film 50 available from Klocker as type PR-180-14. The polymeric mold 30 and the 0.005 inch (125 micron) PVC film to be replicated, along with a higher melt point carrier film 0.002 inch (50 micron) PENN 51 are all fed into the first of four pressure rollers 53. All three films (30, 50 and 51) are heated by hot roll 33 while the pressure rolls 53 flow the molten PVC polymer into the pattern on elliptical mold 30. It should be noted that the 150° F. (66° C.) temperature is only hot enough to melt the film 50 and not the mold 30 or carrier film 51.

The hot film 54, now with the pattern transferred to the surface, is solidified again by cooling station 55. The PVC film 50 and PENN carrier film 51 are now removed together from the mold 56, then wound into rolls 57.

Microscopic examination of the film 57 removed from the mold 30 showed good replication of the Fresnel grooves. Using the same machine and conditions, 0.006 inch (150 micron) polysulfone film was scribed with grove lines of 0.001 inch (25 microns) depth and used as a mold to replicate the pattern in Auto Haas DR100 impact modified PMMA. Microscopic examination demonstrated good replication of the groove pattern. As a result it was determined that higher melt point polymer molds such as polycarbonate, polysulfone and others can be used as a mold to accurately form copies of lower melt point substrates such as PVC, acrylic and other lower melting point polymers.

Figure 8:
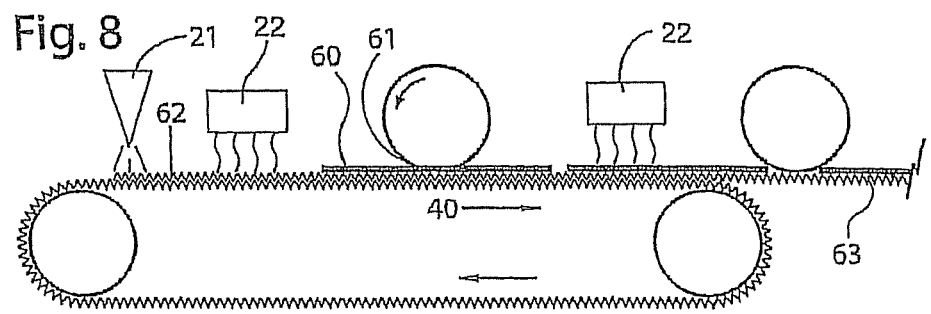
FIG. 8 is a schematic view of an apparatus to laminate thin layers of microstructured film to a ridged substrates.

Referencing FIG. 8, ridged substrates such as 0.375 inch (9.5 mm) polycarbonate sheets 60 can be laminated at roller 61 to the molten microstructured film 62, preheated by IR station 21, and then cured by station 22. Cured polymer with the microstructured pattern attached then becomes an integral part of the finished composite.

Figure 8A:
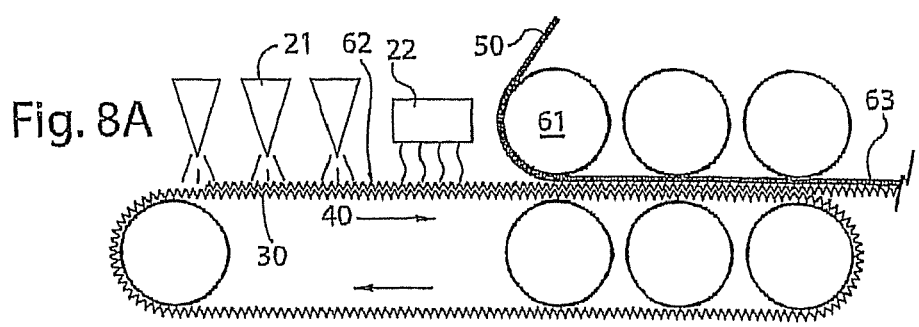
FIG. 8A is a schematic view of an apparatus to laminate thin layers of microstructured film to flexible substrates.

Referencing FIG. 8A, a flexible substrate such as 0.006 inch (150 microns) polycarbonate 50 can be laminated at roller 51 to the molten microstructured film 52, preheated by IR station 22. Cured polymer with the microstructured pattern attached at 53 becomes an integral part of the finished composite.

Figure 9:
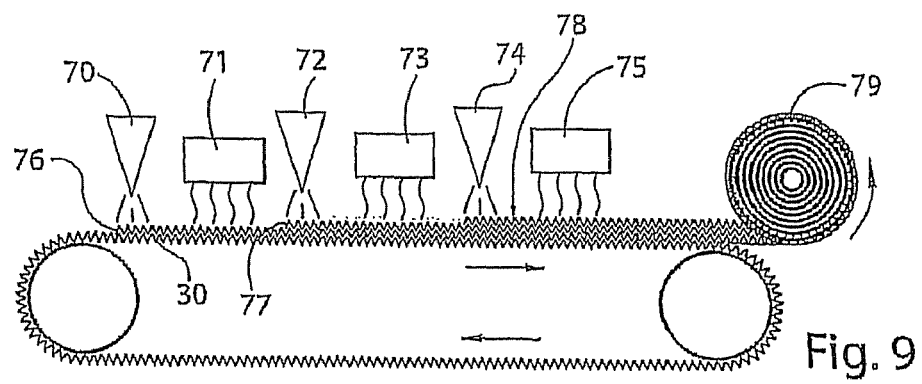
FIG. 9 is a schematic view of the apparatus to make continuous microstructured product that consists of multiple polymeric layers.

Referencing FIG. 9, a method to fabricate a continuous microstructured product consisting of different polymer layers is achieved by using applicator gun 70 for the first layer 60, which is cured by IR heating station 71. Applicator gun 72 applies the second layer 61, cured by IR heating station 73. Applicator gun 74 applies the next layer 62 which is cured by IR cure station 75 and so on until all required layers are applied and cured. The final product is then removed from the mold 63 and wound into rolls 64.

Figure 10:
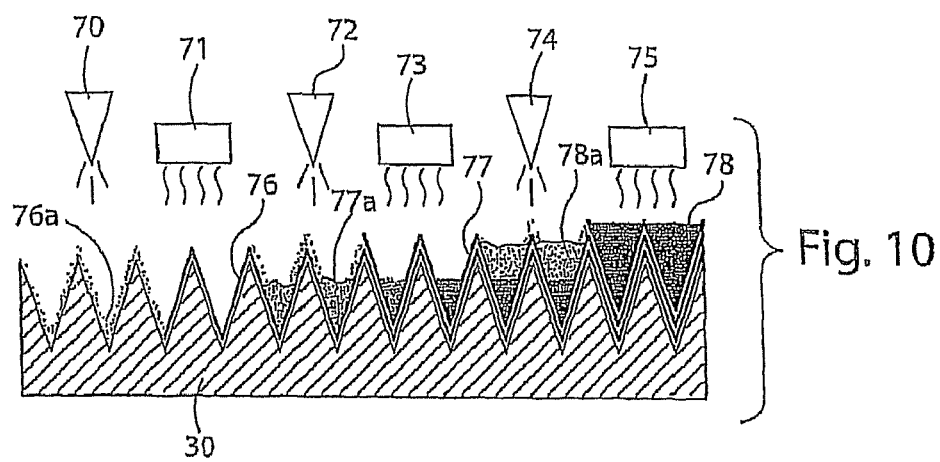
FIG. 10 is an enlarged view of the different layers in FIG. 9.

FIG. 10 is an enlarged side view of the different polymer layers in FIG. 9. Applicator gun 40 applied the first layer of powder 41 onto mold 42. The first layer 41 is melted and cured 43 by IR or UV at station 44. The second layer 45 is applied by applicator gun 46 which is melted and cured by IR or UV station 48. The third layer 49 is applied by gun 50 which is melted and cured by IR or UV station 52.

Figure 11:
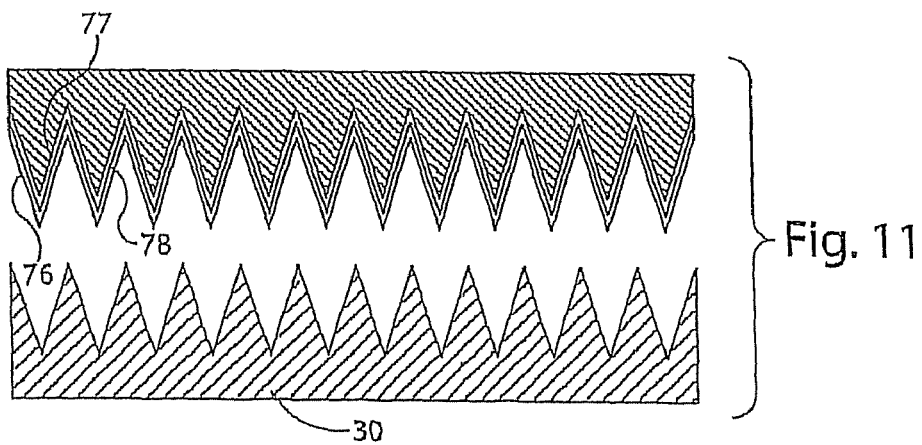
FIG. 11 is an enlarged view of the cured layers from FIG. 9 fused together.

Referencing FIG. 11, the layers 53, 54, and 55 have been fused together and are removed as one film from mold 56.

Figure 12:
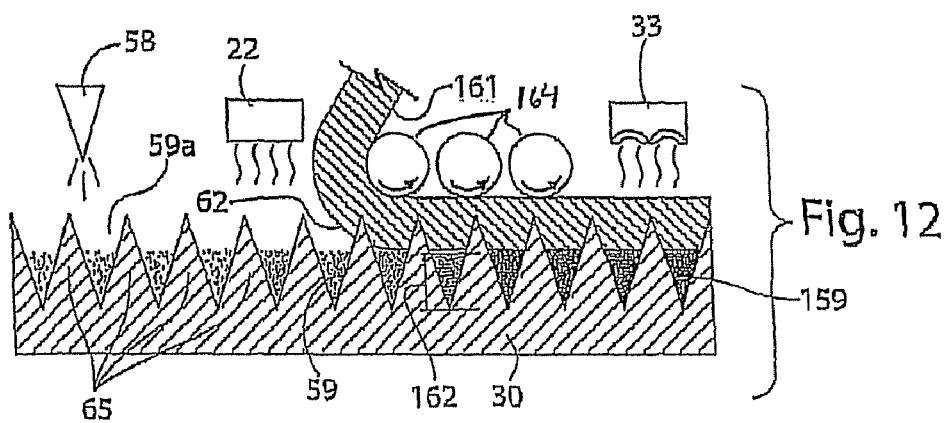
FIG. 12 is a schematic view of the apparatus to make continuous microstructured product with precision through holes or vias.

FIG. 12 illustrates one preferred method to make precision microstructures with through-holes or vias using a layer of powdered polymer 57 that is applied onto the mold by gun 58 to some predetermined level so it only partially fills the mold depth after being melted at 59 by IR cure station 60. A soft polymer sheet 61 of polyethylene, polyester or similar resiliency then is applied to the surface 61 and pressed into the mold 42 to press the film layer 61 uniformly to some specific level 63 and then finally cured at by UV or IR station 64. The sheet 61 then may be removed and separated from the film having the vias formed thereon. The shape of the vias will be determined by the shape of the mold protuberances 59.

Figure 12A:
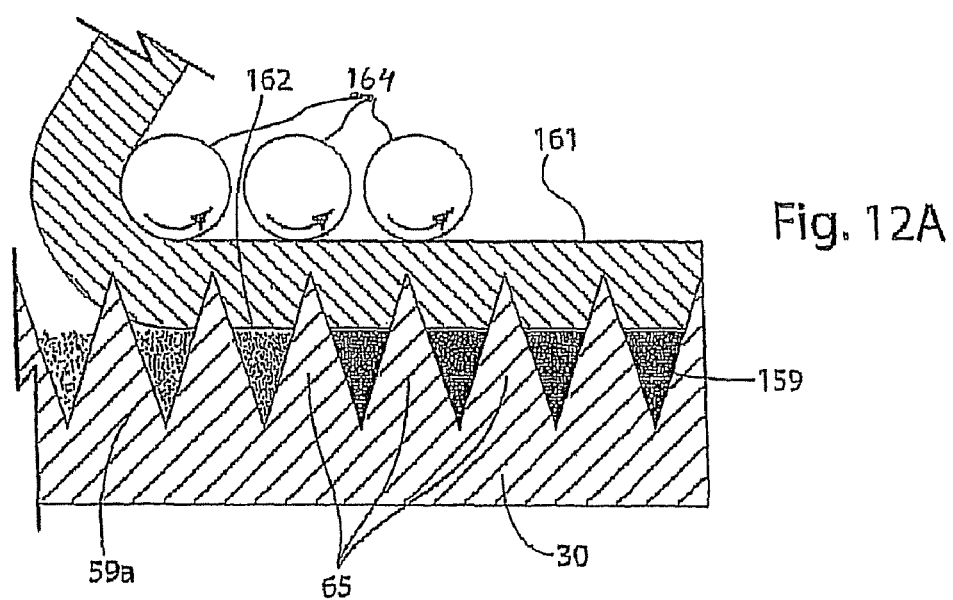
FIG. 12A is an exploded view of the composite layers that form the precision through holes.
Figure 12B:
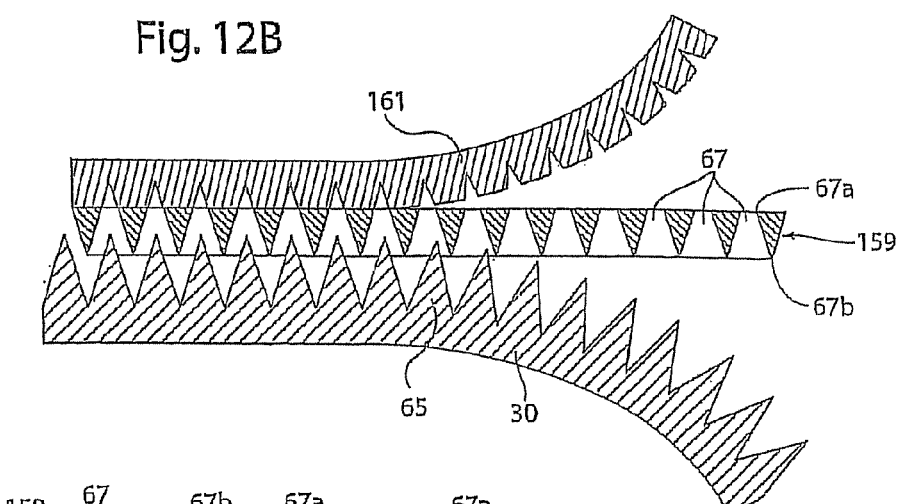
FIG. 12B is a plan view of the bottom mold layer and top polymer layer being peeled away revealing the fabricated polymer film with precision through-holes.

FIG. 12A is a side view of FIG. 12B illustrating mold 42 being partially filled with polymer 63 and the mold protuberances penetrating the soft, top layer of polymer film.

FIG. 12B is a side view of FIG. 12A after cooling with the mold portion 65 being peeled away from the bottom of the cured powder coating 59 and the soft upper film being peeled away from the top 61 of the cured powder coating 59. The resulting polymer film layer shows through holes accurately formed as a permanent feature of the replicated film 59.

Figure 12C:
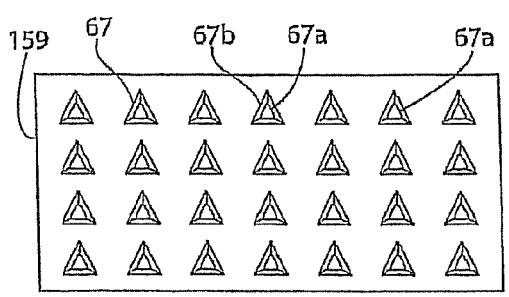
FIG. 12C is a top down view of the film with through-holes as formed by the apparatus in FIG. 12.
Figure 12E:
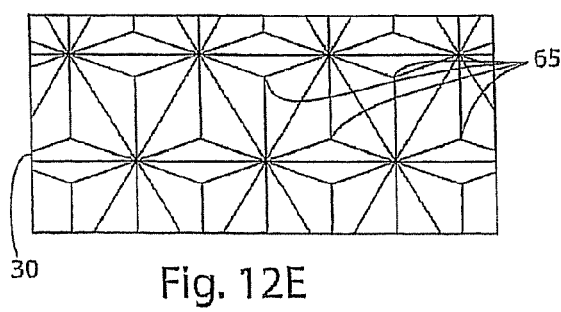

FIG. 12C is a top down exploded view of the mold 42 as used in FIG. 12 and FIG. 12A the polymer layer 66 removed from the mold with precision through holes 67 formed through the polymer.

Figure 12D:
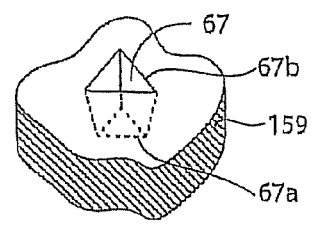

FIG. 12D is a further exploded view of the through holes 67 shown in FIG. 12C.

Figures 13, 14:
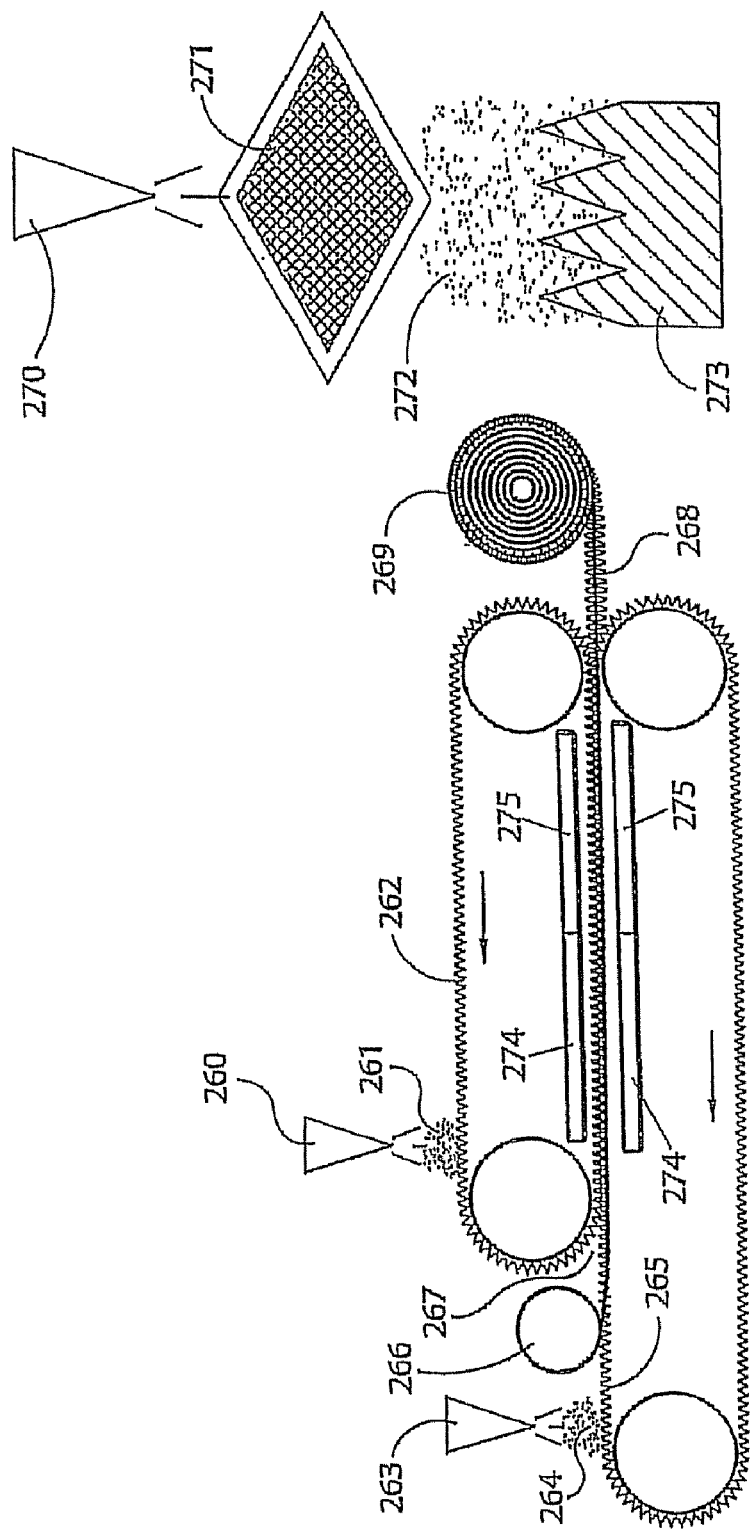
FIG. 13 is a perspective view of the apparatus to fabricate two-sided microstructured products.
FIG. 14 is an end view of the apparatus to apply addition layers of powder coating over the initial electrodeposited layer.

FIG. 13 is a side view of apparatus which has demonstrated a capability to fabricate two-sided microstructured products. The apparatus consisting of a double-band press similar to that sold by Hymmen GmbH of Bielefeld, Germany, as models ISR and HPL which are examples of continuous press, high-speed, high-pressure processing machinery. By incorporating two belts 62 and 65 and individual applicator guns 63 and 60, powder coated polymer is electrodeposited on to each belt and then combined with a thicker backing film 66 laminated between the top and bottom belt 67 fusing the coating deposited on to each belt. The final product, in this illustration is a two-sided microstructured film 68 that is wound into rolls 69.

Double band presses of this type can heat and then cool polymer substrates as thick as 0.25 inches thick (2.54 cm) at high speeds as high as 30 to 60 feet per min (10-20 meters min) or more. Apparatus such as disclosed double-band press is capable of processing temperatures as high as 662° F. (350° C.) and pressure as high as 1430 psi (100 bar). The combination of high temperature and high pressure over the entire surface of the belt makes this apparatus uniquely suited as a means to continuously fabricate microstructured and nanostructured polymer layers.

FIG. 14 is a side view of an apparatus consisting of a positively charged screen, which is used to accelerate the powder to achieve high velocity impact on the surface of the substrate to be coated. It is known in the powder coating industry that as powder is deposited to thicknesses of 0.005 inches (125 microns) to 0.006 inches (150 microns) and more, the insulating properties of the coating will reduce the ability of the coating to be applied to greater thickness because the electrostatic charge is reduced. Once the initial 0.005 inch (125 microns) to 0.006 inch (150 microns) is applied and cured additional powder could be applied by the use of an accelerating system to build thicker layers. This technique could be particularly useful if the initial coating is warm which helps the subsequent layers to stick to the first layer.

Figure 15:
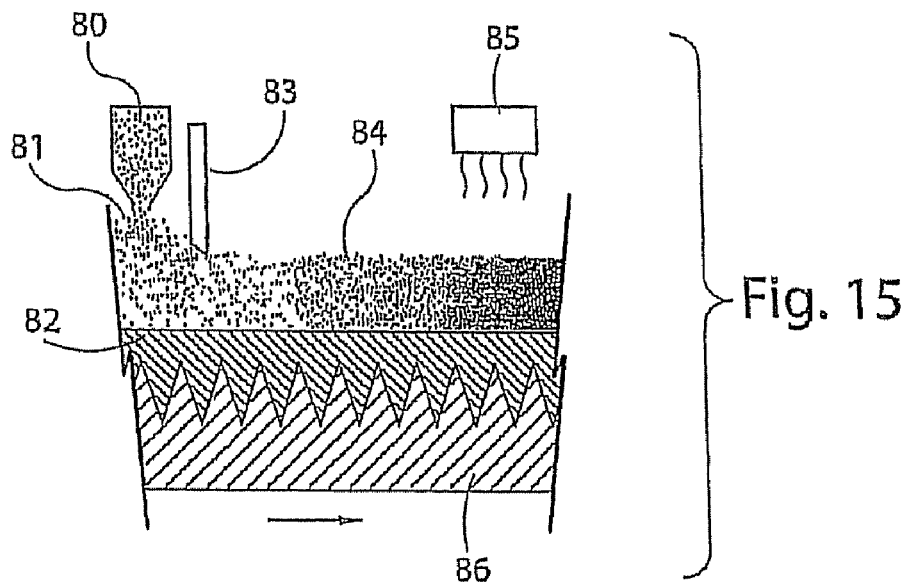
FIG. 15 is a perspective view of the apparatus to apply thick layers of powder coating after the initial electrodeposited layer.

FIG. 15 is a side view of a mechanical apparatus used to apply thick layers over the initial electrodeposited powder coating layer. A gravity feed hopper or similar device 80 applies powder coating 81 over the top of the first powder coated layer 82. A metering knife 83 applies the powder at a controlled thickness 84 which is then cured by IR or UV station 85. Both layers are fused together and later removed from mold 86.

A powder coating device of this type is used to apply thick layers of polymers once the initial layer has covered the micro features and been cured. Since the first electrodeposited layer has now replicated the microstructures or nano-structures with optical precision the balance of the coating can be applied in macro cross-sections and fused to the first layer to achieve thickness greater than would normally be done using standard powder coating techniques. By this means the process could achieve thicknesses of several-millimeters if desired.

Figure 16:
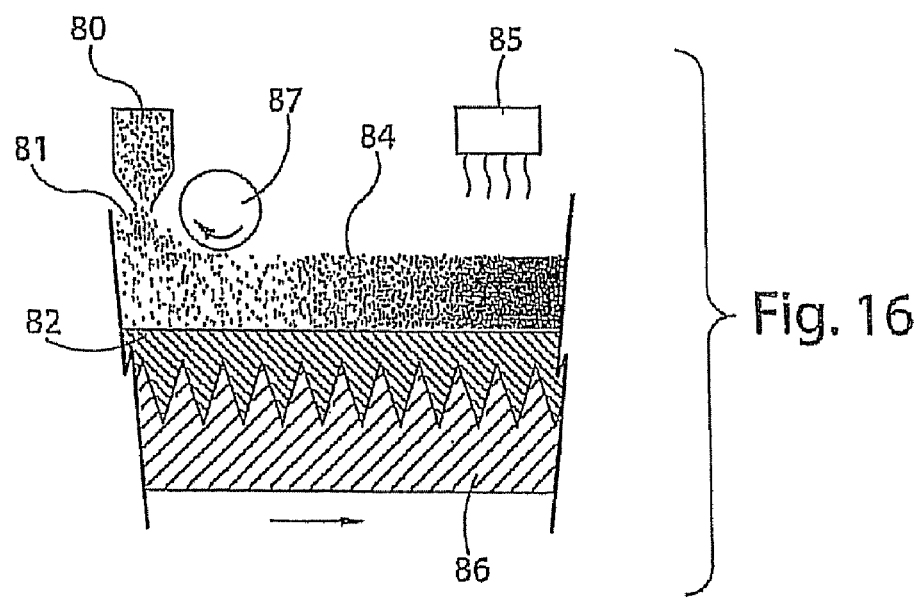
FIG. 16 is a perspective view of another apparatus to apply thick layers of powder coating after the initial electrodeposited layer.

FIG. 16 is a side view of an alternative mechanical apparatus also used to apply thick layers over the initial electrodeposited powder coating layer. In this case the powder coating is again applied by a hopper 80 applies powder coating 81 over the top of the first powder coated layer 82. A metering roll 83 is then used to apply a controlled thickness of the powder 84 which is then cured by IR or UV station 85.

While the invention has been described in conjunction with a preferred embodiment, it will be obvious to one skilled in the art that other objects and refinements of the present invention may be made with the present invention within the purview and scope of the present invention.

The invention, in its various aspects and disclosed forms, is well adapted to the attainment of the stated objects and advantages and others. The disclosed details are not to be taken as limitations on the invention, except as those details may be included in the appended claims. The embodiments of the invention in which an exclusive property or privilege is claimed are as follows:

What is claimed is:

1. A rigid article comprising at least one surface with a microstructured or nanostructured pattern on at least a portion of said surface, said article comprising a first flexible polymeric layer having first and second opposing surfaces, said pattern being formed on said first surface thereof, and a second rigid polymeric layer more rigid than said first layer, said second layer being integrally bonded to said second surface of said first layer with no bonding agent therebetween to form a unitary article more rigid than said first layer.

2. The article of claim 1 wherein said first polymeric layer and said second polymeric layer are formed of different polymers.

3. The article of claim 2 wherein one of said first and second polymeric layers is formed of a thermoset polymer, and the other of said first and second layers is formed of a thermoplastic polymer.

4. The article of claim 1 wherein said first polymeric layer has a thickness of about 100-250 microns.

5. The article of claim 1 wherein said structures of said microstructured or nanostructured pattern are up to about 64 microns tall.

6. The article of claim 1 wherein said second polymeric layer has a thickness of about 9 mm.

7. The article of claim 1 wherein at least a portion of said pattern is retroreflective.

8. The article of claim 1 wherein at least a portion of said pattern comprises a Fresnel lens.

9. The article of claim 1 wherein said first layer is formed from a polymer selected from the group consisting of polycarbonate, polyesters, acrylics, urethanes, nylons, polypropylenes, polyethylenes, polyvinylchlorides and silicones.

10. The article of claim 1 wherein said first layer is formed of a thermoset polymer.

11. The article of claim 10 wherein said first layer is formed from a polymer selected from the group consisting of epoxies and epoxy-polyesters.

\* \* \* \* \*